United States Patent

Nakayama et al.

[11] Patent Number: 5,986,594
[45] Date of Patent: Nov. 16, 1999

[54] IMAGE COMPRESSION BY ARITHMETIC CODING WITH LEARNING LIMIT

[75] Inventors: Tadayoshi Nakayama, Tokyo; Yoshinobu Mita, Kawasaki; Hidefumi Osawa, Kawaguchi, all of Japan

[73] Assignee: Canon Kabushiki Kaisha, Tokyo, Japan

[21] Appl. No.: 08/925,766

[22] Filed: Sep. 9, 1997

[30] Foreign Application Priority Data

Sep. 11, 1996 [JP] Japan ................................. 8-240473

[51] Int. Cl.⁶ ................................................. H03M 7/00
[52] U.S. Cl. ............................................................ 341/107
[58] Field of Search ............................................ 341/107

[56] References Cited

U.S. PATENT DOCUMENTS

| | | | |
|---|---|---|---|
| 4,215,374 | 7/1980 | Mizuno | 358/260 |
| 4,470,072 | 9/1984 | Tanaka et al. | 358/260 |
| 4,494,108 | 1/1985 | Langdon, Jr. et al. | 341/107 |
| 5,136,396 | 8/1992 | Kato et al. | 358/426 |
| 5,262,873 | 11/1993 | Ishizuka | 358/443 |
| 5,331,426 | 7/1994 | Kato et al. | 358/426 |
| 5,379,355 | 1/1995 | Allen | 382/56 |
| 5,381,145 | 1/1995 | Allen et al. | 341/107 |
| 5,418,863 | 5/1995 | Ando | 382/56 |
| 5,422,734 | 6/1995 | Kang | 358/429 |
| 5,577,132 | 11/1996 | Yokose et al. | 382/238 |
| 5,579,412 | 11/1996 | Ando | 382/240 |
| 5,594,813 | 1/1997 | Fandrianto et al. | 382/236 |
| 5,650,783 | 7/1997 | Murashita et al. | 341/107 |
| 5,655,032 | 8/1997 | Ohsawa et al. | 382/238 |
| 5,689,589 | 11/1997 | Gormish et al. | 382/239 |
| 5,784,497 | 7/1998 | Ishizuka et al. | 382/247 |
| 5,848,194 | 12/1998 | Ishizuka et al. | 382/247 |
| 5,886,655 | 3/1999 | Rust | 341/107 |

FOREIGN PATENT DOCUMENTS

| | | | |
|---|---|---|---|
| 56-156072 | 12/1981 | Japan . | |
| 4303932 | 10/1992 | Japan . | |
| 8172534 | 7/1996 | Japan . | |
| 8181869 | 7/1996 | Japan . | |
| 8-223054 | 8/1996 | Japan | H03M 7/40 |
| 8256268 | 10/1996 | Japan . | |
| 9-74489 | 3/1997 | Japan . | |
| 9135175 | 5/1997 | Japan . | |

OTHER PUBLICATIONS

S. J. Urban, "Review of standards for electronic imaging for facsimile systems", Journal of Electronic Imaging, Jan. 1992, pp. 5–21.

*Primary Examiner*—Howard L. Williams
*Attorney, Agent, or Firm*—Fitzpatrick Cella Harper & Scinto

[57] ABSTRACT

Disclosed are an image processing method and apparatus whereby the capability of coding/decoding processing accompanied by learning is improved, this also making it possible to achieve high-speed image formation processing without error. The apparatus includes a coder for generating coded data by arithmetically coding image data, a counter for counting the number of times learning is performed by the coder, and a comparator which, when a count recorded by the counter attains a value stored in a register, stops the learning operation executed by the coder.

21 Claims, 7 Drawing Sheets

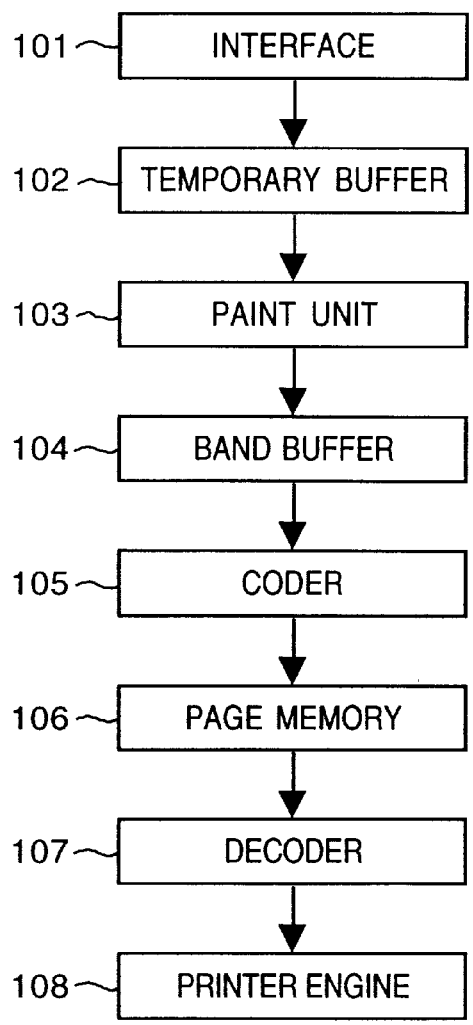
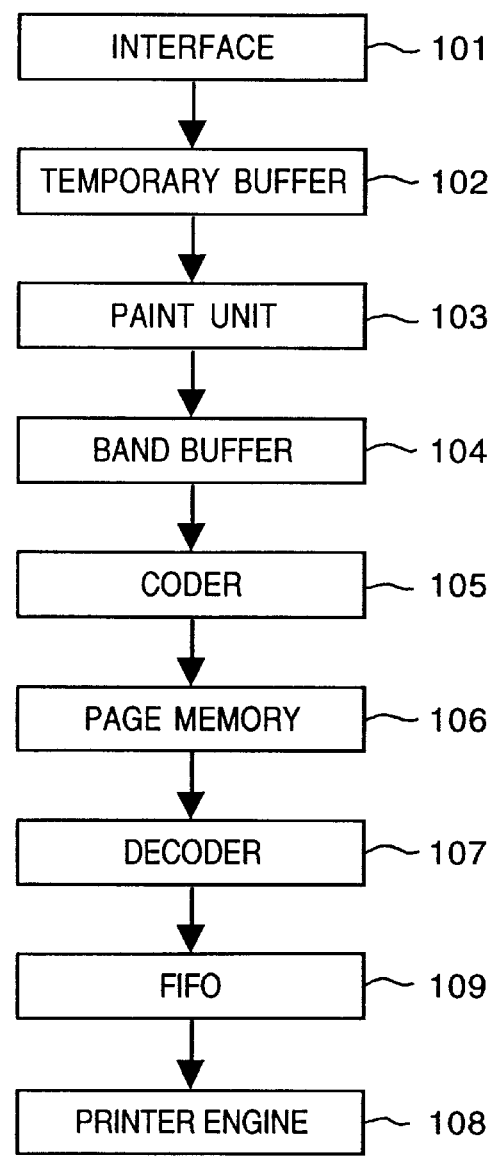

IMAGE COMPRESSION BY ARITHMETIC CODING WITH LEARNING LIMIT

BACKGROUND OF THE INVENTION

This invention relates to an image processing method and apparatus. More particularly, the invention relates to an image processing method and apparatus for compressing and saving image data and expanding the image data when the data is printed or displayed.

In the prior art, image data or data in page description language (abbreviated to PDL below) that has been transferred from a computer to an image output unit such as a printer is developed in a controller of the image output unit. While this is being performed, bitmap data resulting from development is sent to the engine of a printer.

However, in a case where the content developed in complicated in nature, the development of the data cannot keep pace with printing. In such case the bitmap data that has been developed is stored temporarily in a memory (referred to as a "page memory" below). When all data has been fully developed and the bitmap data has been stored in memory, the bitmap data is then sent to the printer engine successively from the beginning of the data.

In a scenario where the paper printed on is of size A3 and has a resolution of 600 dpi, the quantity of data of the full bitmap is 8 MB, even if there is only one bit per pixel (i.e. each pixel is represented by a binary value). Thus a large-capacity memory is required, resulting in a more costly printer.

To solve this problem, an arrangement of the kind shown in FIG. 1 has been considered.

The arrangement of FIG. 1 includes an interface 101 for accepting data from a computer, a temporary buffer 102 for temporarily storing the data that has been accepted from the computer, a paint unit 103 for developing the data that has been accepted from the computer, a band buffer 104 for writing bitmap data developed by the paint unit 103, a coder 105 for compressing and coding the bitmap data from the band buffer 104, a page buffer 106 for storing the data compressed and coded by the coder 105, a decoder 107 for decoding the coded data in the page buffer 106, and a printer engine 108 for printing the bitmap data obtained by the decoding operation of the decoder 107.

The data accepted from the computer is eventually output to the printer engine 108 upon passing through the above-mentioned blocks in the order mentioned.

By virtue of this arrangement, the 8-MB capacity required for the page memory prior to compression is reduced to one-half or one-fourth. Though the band memory 104 is required anew and the amount of memory thus increases correspondingly, the total amount of memory required overall is reduced if the unit (referred to as a "band") in which the data is developed is made 1/16 to 1/20 of one page.

Since the decoder 107 and engine 108 are directly connected in the arrangement of FIG. 1, the data output speed of the decoder 107 and the data input speed of the engine 108 must be made to agree. As there are a variety of coding/decoding methods available, it will suffice to employ a coding/decoding method that satisfies this requirement.

In order to reduce the capacity of the page memory as much as possible to satisfy the demand for lower cost in this case, it is desired that the compression method used assure that the lowest value of the compression rate will exceed a given fixed value for any kind of bitmap data (text data, graphics data, images, etc.).

Some candidates are JBIG coding having a learning function whereby the two-dimensional features of bitmap data to be compressed are learned, standardized as ISO/IEC International Standard 11544, Q-Coder (proposed by IBM Corporation) which greatly influenced the JBIG coding, arithmetic coding (proposed by Langdon and Rissanen) which is the basis of the Q-Coder, and so on.

With JBIG coding, learning is performed by updating the content of a RAM which stores a predicted state. The learning operation (the updating of the content of the RAM) occurs at irregular intervals. When it takes place, the time required for the coding/decoding processing is prolonged owing to the writing of data to the memory. Conversely, the time required for the coding/decoding processing is shortened in instances where learning need not be performed (i.e. when RAM updating need not be carried out).

Accordingly, in a case where coded data is decoded by the JBIG method, the data output rate of the decoder is not fixed and, hence, the output cannot be delivered to the printer engine directly. In particular, in a printer engine that relies upon electrophotography, once the engine has been started, it cannot be stopped until the printing of one full page is completed.

In order to deal with this, a FIFO (first in, first out) memory 109 is provided between the decoder 107 and engine 108. The bitmap data output by the decoder 107 is smoothed in terms of time by the FIFO memory 109 before being delivered to the engine 108.

In a case where the two-dimensional features of the bitmap data to be compressed are not uniform, the compression rate is lowered and learning takes place more frequently, both the coding speed and decoding speed decline by a wide margin.

More specifically, consider a scenario in which coding and decoding can be carried out at 20 MHz when updating of the content of the RAM does not take place, with the coding/decoding operating frequency falling to 10 MHz when the RAM is updated.

The average operating period (which is the reciprocal of the operating frequency) is a linear function of the updating ratio. That is, the average operating period increases linearly with respect to a rise in the updating ratio (see FIG. 8).

When ratio of RAM updating is ¼, the average operating frequency is obtained as follows:

$$1/[(1/10)\times(1/4)+(1/20)\times(3/4)]=16.0 \text{ MHz}$$

When ratio of RAM updating is ½, the average operating frequency is obtained as follows:

$$1/[(1/10)\times(1/2)+(1/20)\times(1/2)]=13.3 \text{ MHz}$$

Accordingly, if the RAM updating ratio is greater than ½ in a situation where the data input frequency of the printer engine is 13.3 MHz or greater, printout cannot be performed in good order.

If the decoding speed continues to be lower than the data input speed of the printer engine or temporarily declines by a wide margin, a problem which arises is that the bitmap data will no longer be able to be temporally smoothed by the FIFO. In such case a printout cannot be obtained.

SUMMARY OF THE INVENTION

Accordingly, an object of the present invention is to provide an image processing method and apparatus whereby the capability of coding/decoding processing accompanied by learning is improved, this also making it possible to achieve high-speed image formation processing without error.

According to the present invention, the foregoing object is attained by providing an image processing apparatus for performing arithmetic coding processing in order to code image data, comprising arithmetic coding means for generating coded data by arithmetically coding n lines of an image in a raster-scan direction, counting means for counting number of learning operations executed by the arithmetic coding means, and learning halting means for halting learning, which is executed by the arithmetic coding means, when the value of a count recorded by the counting means attains a predetermined value.

In another aspect of the present invention, the foregoing object is attained by providing an image processing apparatus for performing arithmetic decoding processing in order to decode the coded data that has been generated by the above-described image processing apparatus, comprising arithmetic decoding means for generating decoded data by arithmetically decoding n lines of an image in a raster-scan direction, counting means for counting number of learning operations executed by the arithmetic decoding means, and learning halting means for halting learning, which is executed by the arithmetic decoding means, when the value of a count recorded by the counting means attains a predetermined value.

In another aspect of the present invention, the foregoing object is attained by providing an image processing apparatus for generating coded data by arithmetically coding image data, generating decoded data by arithmetically decoding the coded data, and performing image formation based upon the decoded data, comprising arithmetic coding means for generating coded data by arithmetically coding n lines of an image in a raster-scan direction, first counting means for counting number of learning operations executed by the arithmetic coding means, learning halting means for halting learning, which is executed by the arithmetic coding means, when the value of a count recorded by the first counting means attains a predetermined value, arithmetic decoding means for generating decoded data by arithmetically decoding the coded data generated by the arithmetic coding means, second counting means for counting number of learning operations executed by the arithmetic decoding means, learning halting means for halting learning, which is executed by the arithmetic decoding means, when the value of a count recorded by the second counting means attains a predetermined value, and image formation means for performing image formation based upon the decoded data generated by the arithmetic decoding means.

In another aspect of the present invention, the foregoing object is attained by providing an image processing method for performing arithmetic coding processing in order to code image data, comprising an arithmetic coding step of generating coded data by arithmetically coding n lines of an image in a raster—scan direction, a counting step of counting number of learning operations executed at the arithmetic coding step, and a learning halting step of halting learning, which is executed at the arithmetic coding step, when the value of a count recorded at the counting step attains a predetermined value.

In another aspect of the present invention, the foregoing object is attained by providing an image processing method for performing arithmetic decoding processing in order to decode the coded data that has been generated by the above-described image processing method, comprising an arithmetic decoding step of generating decoded data by arithmetically decoding n lines of an image in a raster-scan direction, a counting step of counting number of learning operations executed at the arithmetic decoding step, and a learning halting step of halting learning, which is executed at the arithmetic decoding step, when the value of a count recorded at the counting step attains a predetermined value.

In another aspect of the present invention, the foregoing object is attained by providing an image processing method for generating coded data by arithmetically coding image data, generating decoded data by arithmetically decoding the coded data, and performing image formation based upon the decoded data, comprising an arithmetic coding step of generating coded data by arithmetically coding n lines of an image in a raster-scan direction, a first counting step of counting number of learning operations executed at the arithmetic coding step, a learning halting step of halting learning, which is executed at the arithmetic coding step, when the value of a count recorded at the first counting step attains a predetermined value, an arithmetic decoding step of generating decoded data by arithmetically decoding the coded data generated at the arithmetic coding step, a second counting step of counting number of learning operations executed at the arithmetic decoding step, a learning halting step of halting learning, which is executed at the arithmetic decoding step, when the value of a count recorded at the second counting step attains a predetermined value, and an image formation step of performing image formation based upon the decoded data generated at the arithmetic decoding step.

In accordance with the present invention, the capability of coding/decoding processing accompanied by learning is improved, this also making it possible to achieve high-speed image formation processing without error.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a diagram illustrating the construction of an image output apparatus according to the prior art;

FIG. 2 is a diagram illustrating the construction of an image output apparatus according to another example of the prior art;

DESCRIPTION OF THE PREFERRED EMBODIMENTS

Figure 3:
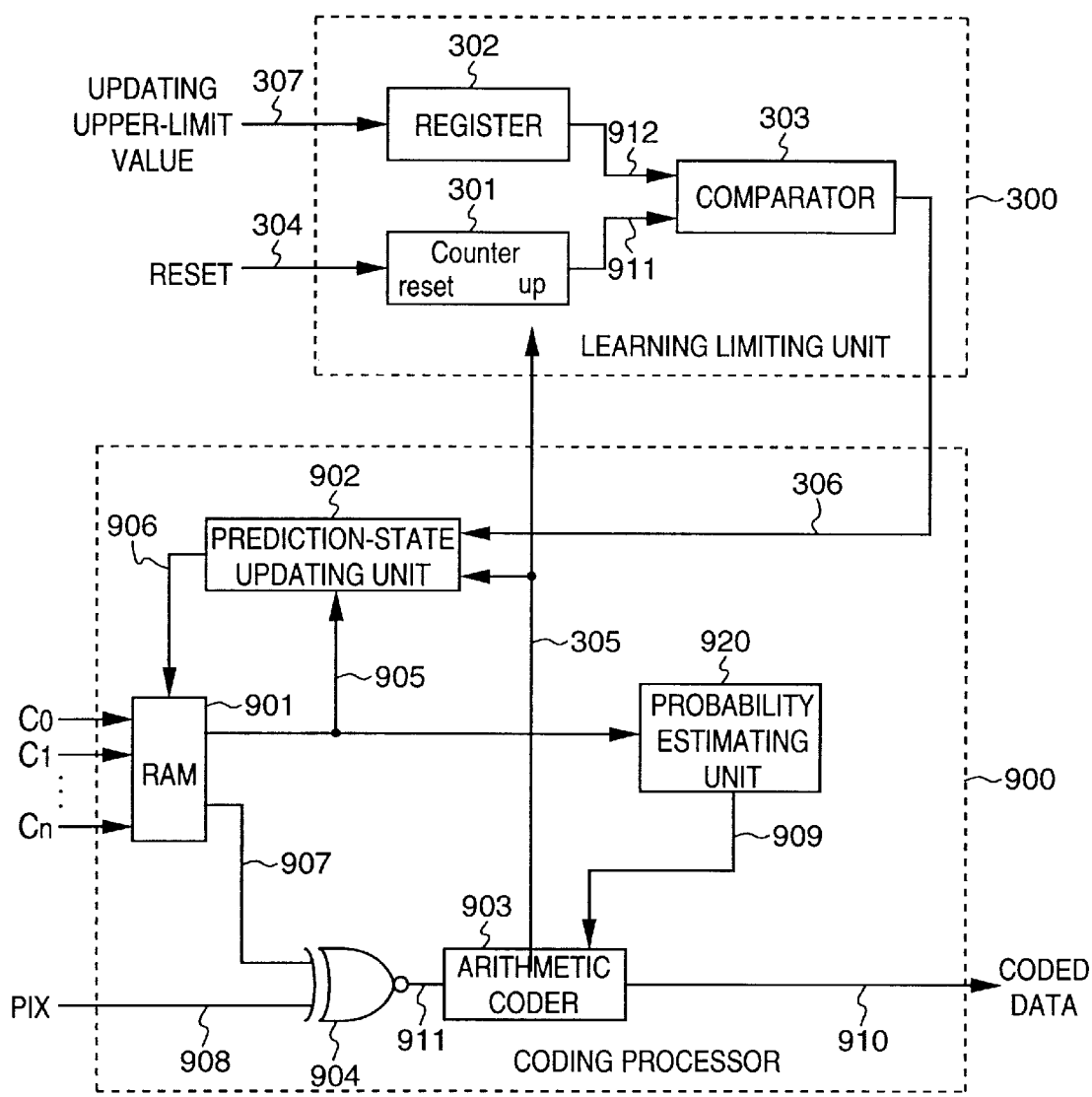
FIG. 3 is a block diagram illustrating the construction of a coder according to a first embodiment of the present invention.

The details of embodiments of the image processing method and apparatus according to the present invention will be described after first summarizing the main features of the invention.

According to the image processing method and apparatus embodying the present invention, the number of times RAM updated in coding processing, particularly arithmetic coding processing, is counted and the number of times is kept below a predetermined number of times, whereby the average decoding speed is made to exceed the data input speed of the printer engine.

As a result, the entry of data to the printer engine will not be interrupted, thereby making printout possible in reliable fashion.

The image processing method and apparatus according to embodiments of the present invention will now be described in detail.

In the embodiments set forth below, image formation is carried out through the overall flow of processing shown in FIGS. 1 and 2. However, the processing corresponding to the coder 105 and decoder 107 constitutes a unique feature of the present invention.

The elements of coding/decoding processing will now be described.

(First Embodiment)

The construction of a coder in the image processing apparatus according to a first embodiment of the invention will be described with reference to FIG. 3.

<Coding Processing>

The coder has a learning limiting unit 300 and a coding processor 900.

The learning limiting unit 300 executes processing to limit the number of times the probability of occurrence of each partial image pattern used in coding processing in the coding processor 900 is updated (learned).

The coding processor 900, on the other hand, performs coding, as in accordance with JBIG coding processing, while updating the probability of occurrence of each partial image pattern.

The processing executed by the coding processor 900 will now be described.

Image signals which enter the coding processor 900 are PIX (908), namely binary data indicative of a pixel of interest that is to be coded, and binary data CX (X=1, 2, ..., n), namely data indicative of pixels neighboring PIX (908).

The neighboring pixels CX (X=1, 2, ..., n) enter a RAM (prediction-state memory) 901.

In dependence upon the pattern of the combination of neighboring pixels, the RAM 901 outputs a predicted value 907 of the corresponding pixel of interest PIX (908) and a status value 905, which serves as the basis of a probability estimation. The output predicted value 907 is "0" or "1" and enters an exclusive NOR gate 904.

The status signal 905 enters a prediction-state updating unit 902 and a probability estimating unit 920, described later.

The exclusive NOR gate 904 determines whether the pixel of interest PIX (908) and the predicted value 907 agree or not and outputs "1" if the two agree and "0" if they do not. The output of the gate 904 enters an arithmetic coder 903 via a signal line 911.

The arithmetic coder 903, which performs coding based upon the input 911 from the exclusive-NOR gate 904 and an estimated value 909 of probability that enters from the probability estimating unit 920, outputs coded data 910.

The arithmetic coder 903 further outputs an update signal 305 based upon the input 911 from the exclusive-NOR gate 904, the estimated value 909 of probability that enters from the probability estimating unit 920 and an update-halt request signal 306 that enters from a comparator 303, described below.

When the update-halt request signal 306 that enters from the comparator 303 is active, the update signal 305 ultimately is inhibited from becoming active even if an internal signal that activates the update signal 305 based upon the input 911 from the exclusive-NOR gate 904 and the estimated value 909 of probability that enters from the probability estimating unit 920 is active.

The processing operation of the arithmetic coder is disclosed in JBIG specifications and need not be described in detail here. However, the main points are as follows:

The arithmetic coder 903 is internally provided with an A register (not shown) for storing a current coding interval, and with a C register (not shown), which is a code register, for performing a predetermined arithmetic operation based upon the input binary data (911) and outputting the determined as the coded data (910).

When the coding operation is performed, the value of A register obtained is smaller than the preceding value. In order to maintain the accuracy of subsequent operations, therefore, normalization processing is executed in such a manner that the value in the A register will be 8000H or exceed 8000H. Normalization processing involves bit-shifting both the A and C registers. The bit data shifted out from the most significant bit of the C register at this time is the coded data.

When normalization processing is executed, the arithmetic coder 903 outputs the update signal 305, which is a request signal for revising the prediction and state value in the RAM 901.

When the update signal 305 enters, the prediction-state updating unit 902 updates, by a predetermined value, the status value 905 entering from the RAM 901 and sends an updated status value 906 to the RAM 901. In the RAM 901 the updated status value 906 is written as a new status value to the RAM address storing the status value 905, thereby updating the status value.

Thus, as described above, the arithmetic coder 903 outputs the update signal 305 to the prediction-state updating unit 902 whenever it is necessary to update the status value stored in the RAM 901. And then, during updating the status value stored in the RAM 901, the outputting of the status value from the RAM 90 based on the neighboring pixels CX (X=1, 2, ..., n) is interrupted.

Consequently, if the update signal 305 is output frequently, the number of times the RAM 901 is updated increases as well, as a result of which the input of the neighboring pixels CX (X=1, 2, ..., n) to the RAM 901 is delayed. The end result is a decline in coding speed.

The learning limiting unit 300 is provided to solve this problem. The processing executed by this unit will now be described.

The learning limiting unit 300 includes a counter 301 for counting the number of times the update signal 305, which is output by the arithmetic coder 903, becomes active. The counter 301 initializes its internal count when a reset signal 304 is applied thereto. The reset signal 304 is generated whenever a pixel relating to one raster-scan line of an image to be coded enters.

A register 302 stores an upper-limit value set for the update signal counted by the counter 301. The upper-limit value is set beforehand via a signal line 307.

A comparator 303 compares the output (912) of the register 302 and the output (911) of the counter 301. If the two agree or if the output (911) of the counter 301 is greater than the output (912) of the register 302, the comparator 303 outputs the update-halt request signal 306, which requests a halt to updating, to the prediction-state updating unit 902.

The coding processing operation will now be described with reference to FIG. 3.

First, before the coding of one raster-scan line begins, the counter 301 is cleared by the reset signal 304. The coding processing of the image in units of single raster-scan lines then begins.

On the basis of the input 911 from the exclusive-NOR gate 904 and the estimated value 909 of probability that enters from the probability estimating unit 920, the arithmetic coder 903 performs coding and outputs the coded data 910. At the same time, in a case where the input 911 from the exclusive-NOR gate 904 is "0" (which means non-agreement), or at execution of normalization processing performed before the value in the A register becomes smaller than 8000H, as mentioned above, the arithmetic coder 903 outputs the update signal 305 in the active state.

The active update signal 305 enters the counter 301 from the arithmetic coder 903, whereby the count in the counter 301 is incremented. The comparator 303 constantly compares the count with the value that has been set in the register 302. As long as the result of the comparison indicates that the value of the count is less than the value set in the register, updating (i.e. learning) of the status value that has been stored in the RAM 901 is allowed.

When updating of the RAM 901 is performed such a number of times that the comparator 303 judges that the count in counter 301 has become equal to or greater than the value set in the register 302, the comparator 303 outputs the update-halt request signal 306, which is the signal that halts the updating of the status value (RAM 901) in the coding processor 900. The output of the signal 306 continues until the counter 301 is initialized, namely until the counter 301 is reset owing to input thereto of the reset signal 304 generated at the end of one raster-scan line.

Coding continues up to the end of one raster-scan line, without the status value (RAM 901) being updated, during the interval in which updating is halted.

Similarly, with regard to the next raster-scan line, coding processing similar to that of the first raster-scan line is executed after the counter 301 is reset.

It should be noted that the value set in the register 302 is a value obtained by multiplying the number of pixels (bits) of one line to be coded by a predetermined rate at which it is permissible to update the memory.

This rate is set based upon coding frequency when learning is not performed, coding frequency when learning is performed and the rate at which data is transferred to the printer engine. For example, if coding frequency when learning is not performed is 20 MHz and that when leaning is performed must be 16 Mhz or greater, the predetermined rate is equal to or less than ¼. When the number of pixels per 1 line is 7,000 and the predetermined rate is ¼, the register 302 is set to 1,750 (=7,000×¼).

Generally, if coding frequency when learning is not performed is F1 Hz and that when learning is performed must be F2 Hz or greater, the predetermined rate is (F1–F2)/F2 (={(1/F2)−(1/F1)}/(1/F1)), and then the register 302 is set to P(F1–F2)/F2 obtained by multiplying the predetermined rate by a number of pixels (p) per 1 line.

<Decoding Processing>

Decoding processing in which the coded data generated by the above-described coding processing enters and is decoded will now be explained with reference to FIG. 4. It should be noted that since the decoding processing is the reverse of the coding processing set forth above, the elements thereof are obvious from the description of the coding processor and need not be discussed in detail again.

Figure 4:
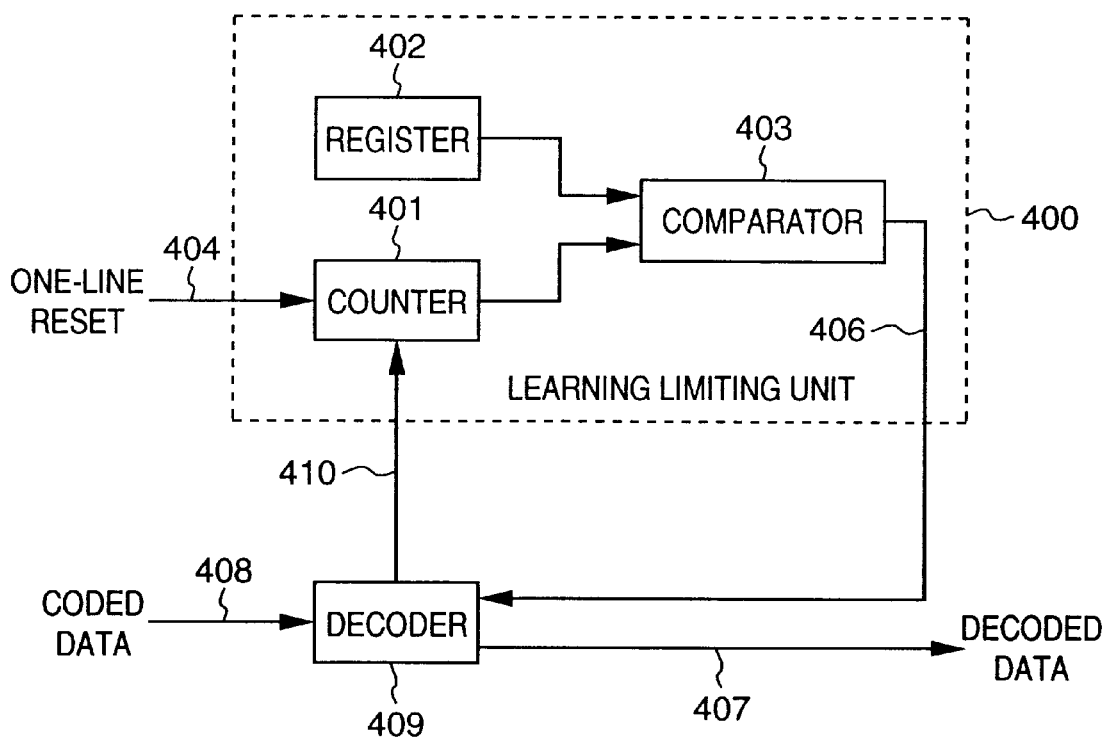
FIG. 4 is a block diagram illustrating the construction of a decoder according to the first embodiment of the present invention.

As shown in FIG. 4, an arrangement for decoding according to this embodiment of the invention includes a learning limiting unit 400, which has a construction similar to that of the learning limiting unit 300 in FIG. 3, and a decoder 409.

The learning limiting unit 400 suppresses the output of a new update signal from the decoder 409 if the update signal output by the decoder 409 becomes equal to or greater than an update upper-limit value that has been stored in the register 402. This suppression of the output is achieved in response to output of an update-halt request signal 406, which is produced by a comparator 403, to the decoder 409.

In comparison with FIG. 3, the register 402 has the same function as the register 302 and is set to the same value as set in the register 302 of FIG. 3, the counter 401 has the same function as the counter 301, and the comparator 403 has the same function as the comparator 303. In other words, the learning limiting unit 400 executes processing similar to that performed by the learning limiting unit 300 set forth above and need not be described again.

The decoder 409 outputs an update signal 410 or suppresses output of this signal in dependence upon the update-halt request signal 406 that enters from the learning limiting unit 400. Further, the decoder 409 applies decoding processing to coded data 408, which has been generated by the coding processing of FIG. 3, and outputs decoded data 407.

Since the processing executed by the decoder 409 is basically the same as that according to the JBIG method, this processing need not be described in detail.

(Second Embodiment)

A second embodiment of the present invention will now be described with reference to FIGS. 5 and 6.

<Coding Processing>

The second embodiment is almost the same as the first embodiment in terms of coding processing (see FIG. 3). In the first embodiment, however, the counter is reset in units of single raster-scan lines, whereas the resetting of the counter in this embodiment is performed in units of n lines in response to an n-line reset signal (604), thereby limiting the number of times the RAM is updated.

Figure 5:
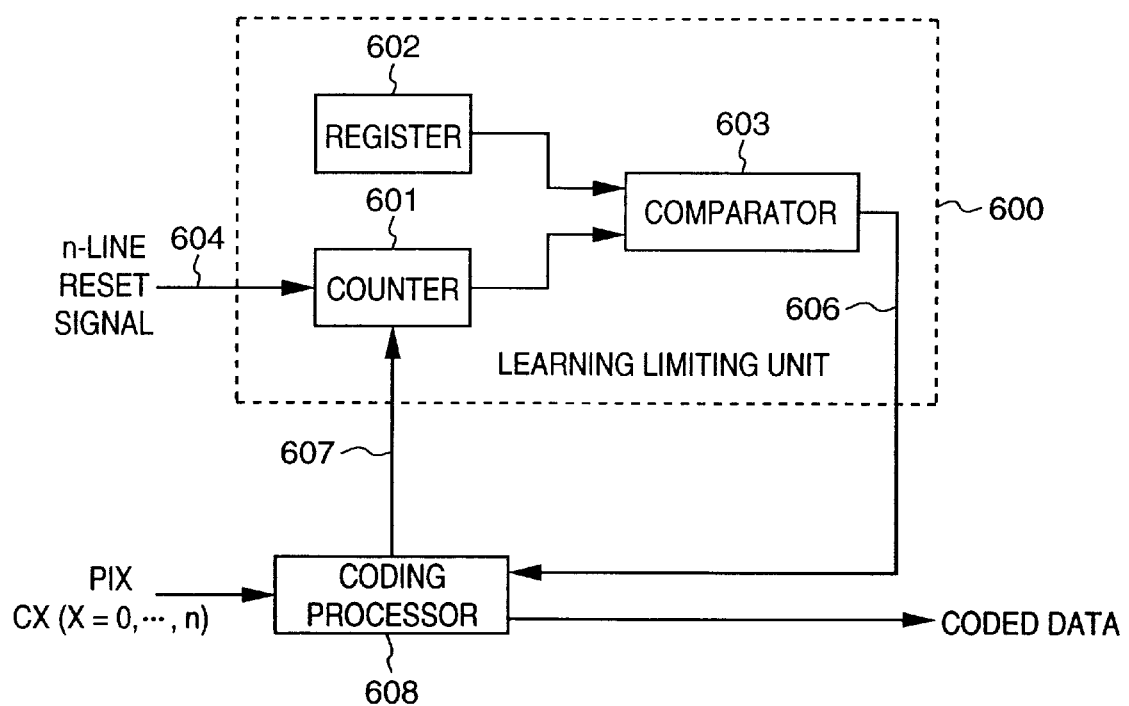
FIG. 5 is a block diagram illustrating the construction of a coder according to a second embodiment of the present invention.

A coding processor 608 in FIG. 5 has a construction the same as that of the coding processor 900 in FIG. 3 and therefore the internal components thereof are not shown.

In comparison with FIG. 3, a register 602, a counter 601 and a comparator 603 have the same functions as the register 302, counter 301 and comparator 303, respectively. In other words, the learning limiting unit 600 executes processing similar to that performed by the learning limiting unit 300 set forth above and need not be described again. A value set in the register 602 is obtained by substituting P in the function P(F1–F2)/F2, which has been shown in the description of the register 302, for a number of pixels in n lines.

According to the second embodiment, the counter 601 is reset in units of n lines. When an update-halt request signal 606 output by the comparator 603 is rendered active, therefore, the request is deactivated upon entry of the next image of n raster-scan lines.

An update signal 607 output by the coding processor 608 corresponds to the update signal 305 of FIG. 3. Independence upon the update-halt request signal 606 that enters from the learning limiting unit 600, the coding processor 608 outputs the update signal 607 or suppresses the output thereof.

<Decoding Processing>

Decoding processing according to the second embodiment will now be described with reference to FIG. 6.

The second embodiment is almost the same as the first embodiment in terms of decoding processing (see FIG. 4). In the first embodiment, however, the counter is reset in units of single raster-scan lines, whereas the resetting of the counter in this embodiment is performed in units of n lines in response to an n-line reset signal (704), thereby limiting the number of times the RAM is updated.

Figure 6:
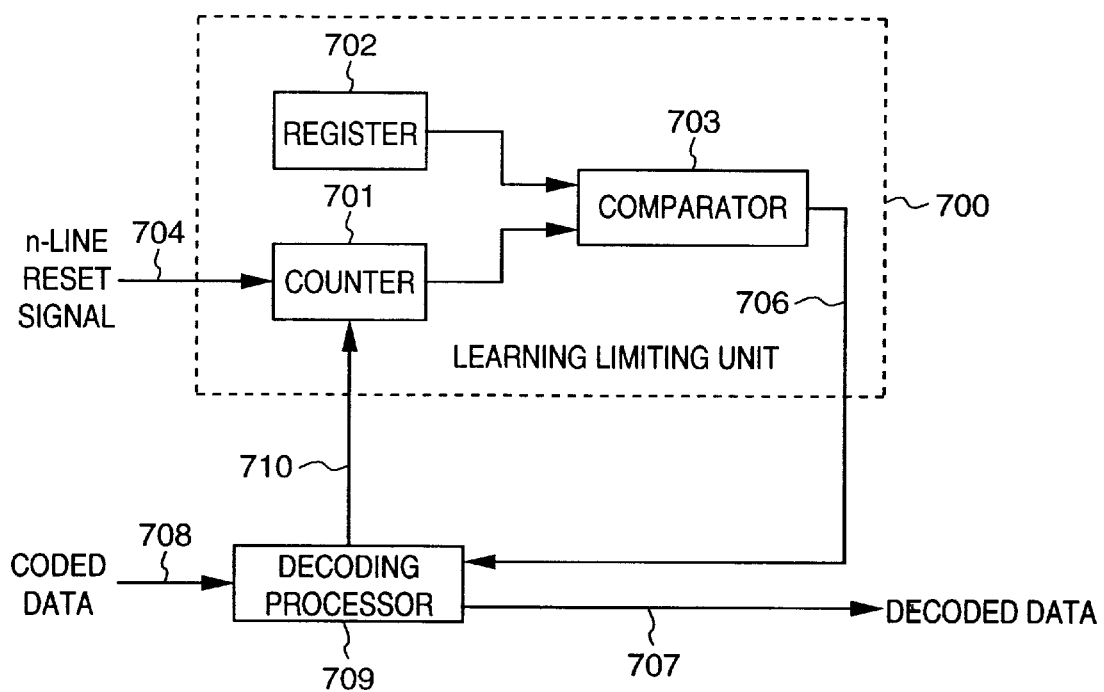
FIG. 6 is a block diagram illustrating the construction of a decoder according to the second embodiment of the present invention.

A decoding processor 709 in FIG. 6 has a construction the same as that of the decoder 409 in FIG. 4.

In comparison with FIG. 4, a register 702, a counter 701 and a comparator 703 have the same functions as the register 402, counter 401 and comparator 403, respectively. The register 702 is set to the same value as set in the register 602 of FIG. 5. In other words, the learning limiting unit 700 differs from that of the foregoing embodiment only in that the counter is reset in units of n lines by the above-mentioned n-line reset signal (704). Since the learning limiting unit 700 executes processing similar to that performed by the learning limiting unit 400 set forth above, this processing need not be described again.

(Third Embodiment)

A third embodiment will now be described with reference to FIG. 7.

In the second embodiment, the number of times memory is updated is simply limited in units of n lines. With this method, however, there are cases where the limitation on the number of memory update operations is used up by first two or three lines of then lines, with memory updating (learning) not being possible at all with the remaining lines. In such case what is learned may develop a deviation and there is a possibility that compression efficiency will decline.

In this embodiment, therefore, another limitation in line units is introduced in such a manner that a deviation will not be produced in what is learned. More specifically, memory updating is allowed without any limitation whatsoever up to e.g. 80% of the number of RAM updating operations per line, and from this point onward a single update of the memory is allowed in response to a memory update request made k times.

Figure 7:
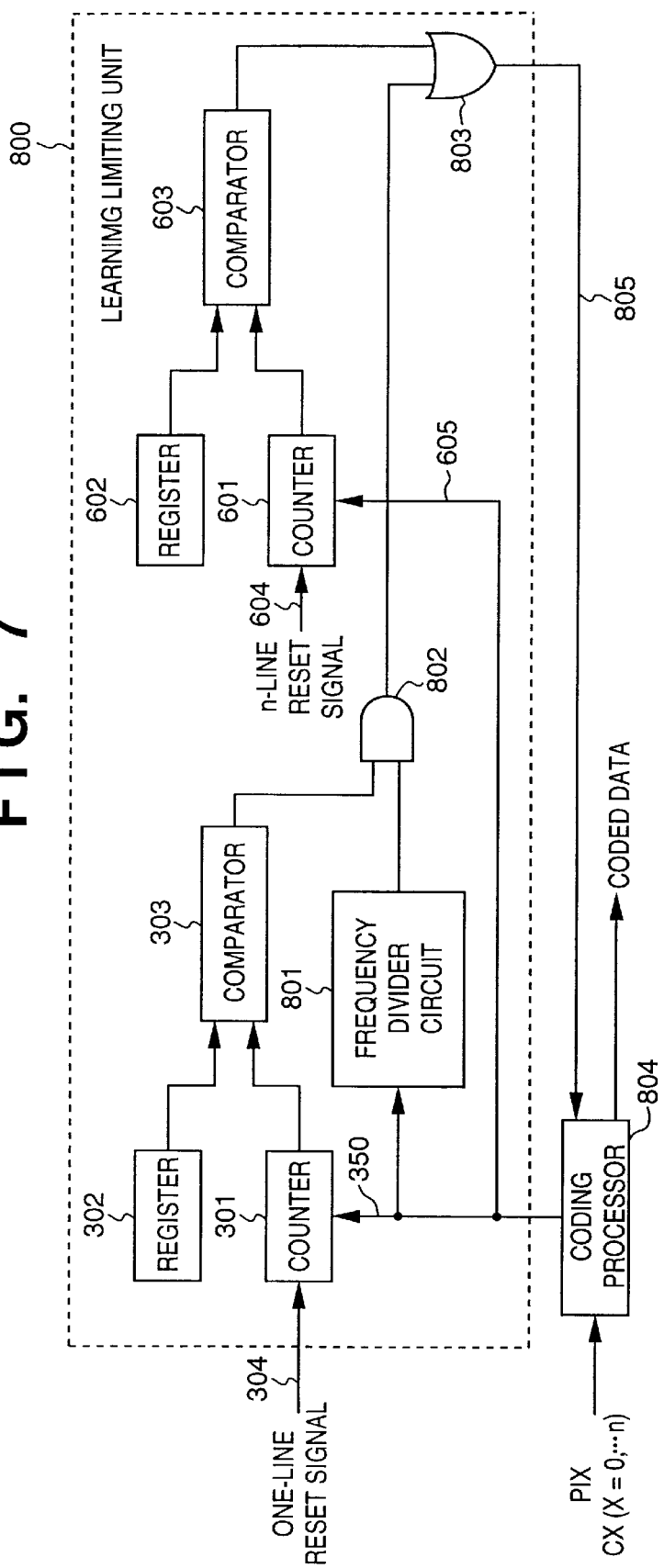
FIG. 7 is a block diagram illustrating the construction of a coder according to a third embodiment of the present invention.
Figure 8:
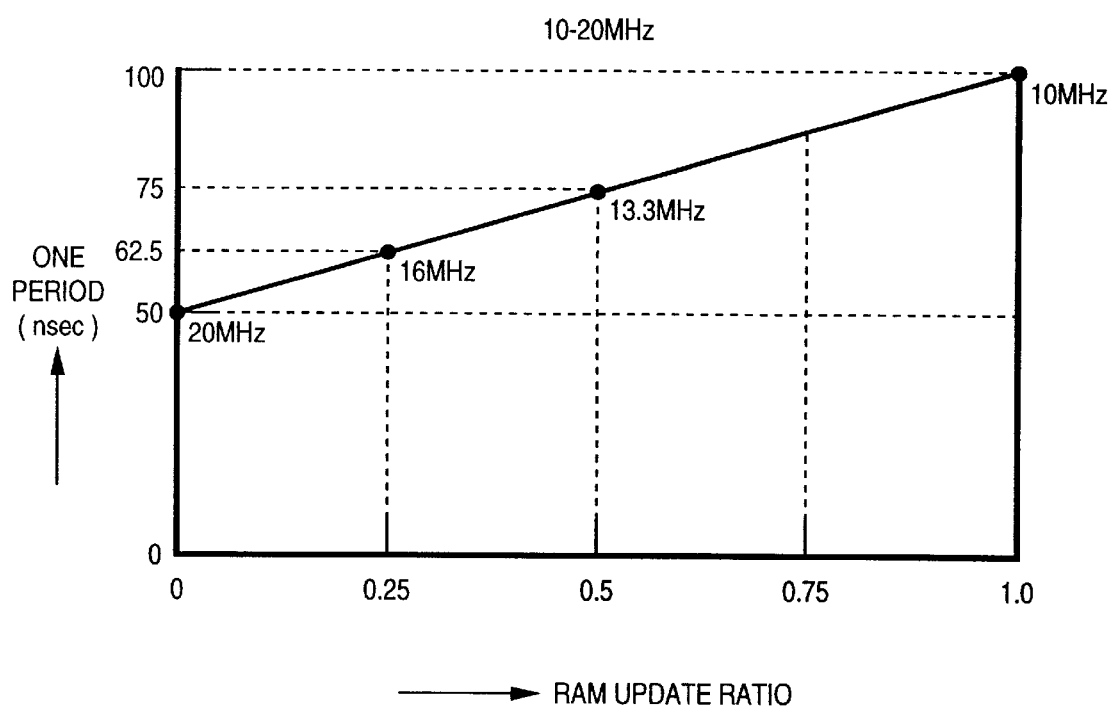
FIG. 8 is a graph showing the manner in which average operating period (reciprocal of operating frequency) linearly increases with respect to a rise in memory updating ratio.

A coding processing arrangement for implementing this limitation is illustrated in FIG. 7.

The coding processing arrangement according to this embodiment is constituted by the learning limiting unit 800 and coding processor 804. The latter executes processing similar to the coding processing performed by the coding processor 900 of FIG. 3.

This embodiment has a section controlled in single-line units and a section controlled in n line units. Accordingly, the learning limiting unit 800 is constructed utilizing both the control mechanism employed in the first embodiment and the control mechanism employed in the second embodiment.

Reference numerals 301~305 and 601~605 denote blocks having functions the same as those of the blocks designated by like reference numerals in FIGS. 3 and 6.

A frequency divider circuit 801 having a clock input outputs a low logic level, which has a duration of one clock period, at entry of k-number of clock inputs, and outputs a high logic level at all other times. The frequency divider circuit 801 includes a dividing counter which allows a single update of the memory in response to k memory update requests. The dividing counter counts from "0" up to "k-1" and returns to "0". The frequency divider circuit 801 further includes a detector which outputs "0" when detecting that the count value is "k-1" while outputs "1" when detecting that the count value is other than "k-1". The frequency divider circuit 801 outputs a value from the detector.

When there is not request of memory update from the coding processor 804, the value of the input signal to the frequency divider circuit 801 is "0". At this time the dividing counter does not operate, and it outputs "0".

When the coding processor 804 requires memory update, the value of the input signal value to the frequency divider circuit 801 is "1". At this time, the dividing counter starts to count. When the count value is from "0" to "k-2", the frequency divider circuit 801 outputs "1" because the detector outputs "1". However, if the count value becomes "k-1", the frequency divider circuit 801 outputs "0" because the detector outputs "1". At the next cycle, the dividing counter is return to "0". For example, when k=5 holds, the frequency divider circuit 801 operates as a 5 frequency divider circuit and the dividing counter in the circuit 801 counts in sequence of "0", "1", "2", "3", "4", "0", "1", . . . . When the count values is "4", the detector in the circuit 801 outputs "0", while outputs "1" when the count value is other than "4".

Numerals 802 and 803 denote an AND gate and an OR gate, respectively.

An upper limit on the number of memory update operations per n lines is set in the register 602, in a manner similar to that of the second embodiment. However, an upper limit on the number of update operations per number of lines slightly different from that of the first embodiment is set in the register 302. For example, a value which is 80% of the allowed upper-limit value is set in register 302.

The operation of the arrangement shown in FIG. 7 will now be described.

Before coding starts, the counter 301 is reset by the one-line reset signal 304 and the counter 601 is reset by the n-line reset signal 604. The one-line reset signal 304 is generated every line and the n-line reset signal 604 is generated n lines.

Next, the coding of n lines in the raster-scan direction is carried out. As coding proceeds, learning takes place [i.e. a RAM (not shown) in the coding processor 804 is updated (this RAM corresponds to the RAM in FIG. 3], and the number of times this occurs is counted independently by each of the counters 301 and 601.

The counts in the counters 301 and 601 are compared at all times with values, which have been set in the registers 302 and 602, by the comparators 303 and 603, respectively. As long as the result of the comparison indicates that the value of the count is less than the value set in the register, learning (i.e. updating) is allowed just as heretofore and the above-described updating of the RAM is carried out when learning becomes necessary.

When updating of the RAM is performed such a number of times that the value in the counter 301 exceeds the value set in the register 302, this is sensed by the comparator 303, which responds by outputting the high logic level. As a result, the hitherto inactive output of the frequency divider circuit 801 is rendered active and the frequency divider circuit 801 outputs the low logic level, which has the duration of one clock period, in response to entry of k-number of clock inputs, i.e. memory update requests made k times, so that the memory update request is allowed at a ratio of once per k times.

Before coding shifts to the next line following the completion of coding of one line, the counter 301 is reset to zero by the reset signal 304. The next line is then coded by a control process similar to that described above.

When the number of lines for which coding has been completed approaches n, the value in counter 601 approaches the set value in the register 603 and eventually exceeds this set value at a certain time. When this occurs, it is sensed by the comparator 603 so that the update-halt request signal 805 at the high level is output via the OR gate 803.

By virtue of the processing set forth above, ordinarily update (learning) requests up to 80% are allowed, without any limitation, for every line, with the remaining 20% being allowed while a limitation is applied.

Accordingly, while the above-mentioned RAM updating is being dispersed to a certain degree, more memory updating is allowed for the lines necessary.

Decoding control is similar to coding control, just as in the foregoing embodiments, and need not be described here.

In this embodiment of the invention, it is so arranged that RAM update (learning) requests up to 80% are allowed, without limitation, for each line. However, it goes without saying that this can be set to any ratio by changing the set value in the register 302.

The present invention can be applied to a system constituted by a plurality of devices or to an apparatus comprising a single device.

Though the above-described coding/decoding arrangements are illustrated based upon hardware, it goes without saying that the arrangements can be implemented by software corresponding to the processing. In such case the above-mentioned software would be stored in the memory of an image processing apparatus having a prescribed CPU and printer engine in addition to the memory, and the processing would be executed by the CPU.

Further, it goes without saying that the object of the present invention can also be achieved by providing a storage medium storing program codes for performing the aforesaid functions of the foregoing embodiments to a system or an apparatus, reading the program codes with a computer (e.g., a CPU or MPU) of the system or apparatus from the storage medium, and then executing the program.

In this case, the program codes read from the storage medium implement the functions according to the embodiments, and the storage medium storing the program codes constitutes the invention.

Further, the storage medium, such asa floppy disk, hard disk, optical disk, magneto-optical disk, CD-ROM, CD-R, magnetic tape, non-volatile type memory card or ROM can be used to provide the program codes.

Furthermore, besides the case where the aforesaid functions according to the embodiment are implemented by executing the program codes read by a computer, it goes without saying that the present invention covers a case where an operating system (OS) or the like working on the computer performs a part of or the entire process in accordance with the designation of program codes and implements the functions according to the embodiments.

Furthermore, it goes without saying that the present invention further covers a case where, after the program codes read from the storage medium are written to a function extension board inserted into the computer or to a memory provided in a function extension unit connected to the computer, a CPU or the like contained in the function extension board or function extension unit performs a part of or the entire process in accordance with the designation of program codes and implements the function of the above embodiments.

In a case where the present invention is applied to the above-mentioned storage medium, program codes corresponding to the flowcharts described earlier are stored on the storage medium.

Thus, as described above, the embodiments of the present invention are such that the number of times learning (updating) is performed per one raster-scan line is counted and the count is compared with the upper limit of the number of learning operations, whereby the number of times the RAM is updated per one raster-scan line is kept below a prescribed number of times, thereby making it possible for average decoding speed to surpass the data input speed to the printer engine.

As a result, the entry of data to the printer engine will not be interrupted, thereby making printout possible in reliable fashion.

As many apparently widely different embodiments of the present invention can be made without departing from the spirit and scope thereof, it is to be understood that the invention is not limited to the specific embodiments thereof except as defined in the appended claims.

What is claimed is:

1. An image processing apparatus for performing arithmetic coding processing in order to compress image data, comprising:

arithmetic coding means for generating coded data by arithmetically coding image data;

counting means for counting a number of times learning operations are executed by said arithmetic coding means; and learning halting means which, when the value of a count recorded by said counting means attains a predetermined value, is for halting learning executed by said arithmetic coding means from this moment onward, wherein the predetermined value is an allowed upper-limit value of a number of times learning is performed per n raster-scan lines.

2. The apparatus according to claim 1, further comprising resetting means for resetting said counting means at a period of n raster-scan lines.

3. The apparatus according to claim 2, wherein n is 1.

4. An image processing apparatus for performing arithmetic decoding processing in order to decode coded data that has been generated by the image processing apparatus described in claim 2, comprising:

arithmetic decoding means for reproducing decoded data by arithmetically decoding coded data representing an image;

counting means for counting a number of times learning operations are executed by said arithmetic decoding means; and learning halting means which, when the value of a count recorded by said counting means attains a predetermined value, is for halting learning executed by said arithmetic decoding means from this moment onward, wherein the predetermined value is an allowed upper-limit value of a number of times learning is performed per n raster-scan lines.

5. The apparatus according to claim 4, further comprising resetting means for resetting said counting means at a period of n raster-scan lines.

6. The apparatus according to claim 5, wherein n is 1.

7. An image processing apparatus for performing arithmetic coding processing in order to compress image data, comprising:
   arithmetic coding means for generating coded data by arithmetically coding image data;
   first counting means for counting a number of times learning operations are executed for every line by said arithmetic coding means;
   learning count reducing means which, when the value of a count recorded by said first counting means attains a first predetermined value, is for reducing learning operations executed by said arithmetic coding means from this moment onward;
   second counting means for counting a number of times learning operations are executed for every n lines by said arithmetic coding means; and
   learning halting means which, when the value of a count recorded by said second counting means attains a second predetermined value, is for halting learning executed by said arithmetic coding means from this moment onward.

8. The apparatus according to claim 7, wherein the first predetermined value is about 80% of an allowed upper-limit value of a number of times learning is performed.

9. The apparatus according to claim 7, further comprising resetting means for resetting said first counting means at a period of one raster-scan line and resetting said second counting means at a period of n raster-scan lines.

10. An image processing apparatus for generating coded data by arithmetically coding image data and for generating decoded data by arithmetically decoding the coded data, comprising:
    arithmetic coding means for generating coded data by arithmetically coding image data;
    first counting means for counting a number of times learning operations are executed by said arithmetic coding means;
    first learning halting means for halting learning, which is executed by said arithmetic coding means, when the value of a count recorded by said first counting means attains a predetermined value;
    arithmetic decoding means for generating decoded data by arithmetically decoding the coded data generated by said arithmetic coding means;
    second counting means for counting a number of times learning operations are executed by said arithmetic decoding means;
    second learning halting means for halting learning, which is executed by said arithmetic decoding means, when the value of a count recorded by said second counting means attains a predetermined value;
    image output means for outputting image formation based upon the decoded data generated by said arithmetic decoding means; and
    resetting means for resetting said first and second counting means at a period of n raster-scan lines.

11. The apparatus according to claim 10, wherein n is 1.

12. The apparatus according to claim 10, further comprising image formation means for forming an image based upon the decoded data output by said image output means.

13. An image processing method for performing arithmetic coding processing in order to compress image data, comprising the steps of:
    counting a number of times learning operations are executed by arithmetic coding processing; and
    when the value of the count attains a predetermined value, halting learning executed by said arithmetic coding from this moment onward,
    wherein the predetermined value is an allowed upper-limit value of a number of times learning is performed per n raster-scan lines.

14. The method according to claim 13, wherein n is 1.

15. An image processing method for performing arithmetic decoding processing in order to decode coded data that has been generated by arithmetic coding processing, comprising the steps of:
    counting a number of times learning operations are executed by said arithmetic decoding processing; and
    when the value of the count attains a predetermined value, halting learning executed by said arithmetic decoding processing from this moment onward,
    wherein the predetermined value is an allowed upper-limit value of a number of times learning is performed per n raster-scan lines.

16. The method according to claim 15, wherein n is 1.

17. An image processing method for performing arithmetic coding processing in order to compress image data, comprising the steps of:
    firstly counting a number of times learning operations are executed for every line by arithmetic coding processing;
    when the value of the first count attains a first predetermined value, reducing, every predetermined number of times, the number of learning operations executed by said arithmetic coding processing from this moment onwards;
    second counting means for counting a number of times learning operations are executed for every n lines by said arithmetic coding processing; and
    when the value of the second count attains a second predetermined value, halting learning executed by said arithmetic coding processing from this moment onward.

18. The method according to claim 17, wherein the first predetermined value is about 80% of an allowed upper-limit value of the number of times learning is performed.

19. An image processing method for generating coded data by arithmetically coding image data, for generating decoded data by arithmetically decoding the coded data, and for outputting the decoded data, comprising:
    a first counting step of counting a number of times learning operations are executed by arithmetic coding processing;
    a first learning halting step of halting learning, which is executed by said arithmetic coding processing, when the value of a count recorded at said first counting step attains a predetermined value;
    a step of arithmetically decoding the coded data generated by said arithmetic coding processing;
    a second counting step of counting a number of times learning operations are executed by said arithmetic decoding processing;
    a second learning halting step of halting learning, which is executed by said arithmetic decoding processing, when the value of a count recorded at said second counting step attains a predetermined value;
    an output step of outputting an image the decoded data generated; and
    a resetting step of resetting the counts of said first and second counting steps at a period of n raster-scan lines.

20. The method according to claim 19, wherein n is 1.

21. The method according to claim 19, further comprising a step of forming an image based upon the output decoded data.

* * * * *

UNITED STATES PATENT AND TRADEMARK OFFICE
CERTIFICATE OF CORRECTION

PATENT NO. : 5,986,594
DATED : November 16, 1999
INVENTOR(S) : Tadayoshi Nakayama et al.

It is certified that error appears in the above-identified patent and that said Letters Patent is hereby corrected as shown below:

Title page,
In the title of the invention, "COMPRESSION" should read -- compressing --.
Item [56] REFERENCES CITED, FOREIGN PATENT DOCUMEMTS:

| | | |
|---|---|---|
| "4303932 | 10/1992 | Japan |
| 8172534 | 7/1996 | Japan |
| 8181869 | 7/1996 | Japan |
| 8256268 | 10/1996 | Japan |
| 9135175 | 5/1997 | Japan" should read |
| | | |
| -- 4-303932 | 10/1992 | Japan |
| 8-172534 | 7/1996 | Japan |
| 8-181869 | 7/1996 | Japan |
| 8-256268 | 10/1996 | Japan |
| 9-135175 | 5/1997 | Japan--. |

Column 1,
Line 1, "COMPRESSION" should read -- COMPRESSING --
Line 16, "in" (second occurrence) should read -- is --

Column 3,
Line 1, "this" should read -- thus --.

Column 4,
Line 30, "this" should read -- thus --.

UNITED STATES PATENT AND TRADEMARK OFFICE
CERTIFICATE OF CORRECTION

PATENT NO. : 5,986,594
DATED : November 16, 1999
INVENTOR(S) : Tadayoshi Nakayama et al.

It is certified that error appears in the above-identified patent and that said Letters Patent is hereby corrected as shown below:

Column 8,
Line 67, "Indepen-" should read -- In depen ---.

Column 9,
Line 36, "then" should read -- the n --.

Column 10
Line 10, "not" should read -- no --;
Line 22, "return" should read -- returned --;
Line 48, "FIG. 3]," should read -- FIG. 3) ], --.

Column 11,
Line 52, "asa" should read -- as a --.

Signed and Sealed this

Twenty-first Day of August, 2001

*Attest:*

Nicholas P. Godici

*Attesting Officer*

NICHOLAS P. GODICI
*Acting Director of the United States Patent and Trademark Office*